(12) United States Patent
Hosoe et al.

(10) Patent No.: US 8,477,520 B2
(45) Date of Patent: Jul. 2, 2013

(54) SEMICONDUCTOR MEMORY DEVICE

(75) Inventors: Yuki Hosoe, Tokyo (JP); Kazuki Ishizuka, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 234 days.

(21) Appl. No.: 12/953,659

(22) Filed: Nov. 24, 2010

(65) Prior Publication Data

US 2011/0128764 A1    Jun. 2, 2011

(30) Foreign Application Priority Data

Dec. 2, 2009    (JP) .................................. 2009-274494

(51) Int. Cl.
*G11C 5/02*    (2006.01)
(52) U.S. Cl.
USPC ............. 365/51; 365/203; 365/208; 365/227; 365/230.03
(58) Field of Classification Search
USPC ................................ 365/51, 203, 227, 230.03
See application file for complete search history.

(56) References Cited

U.S. PATENT DOCUMENTS 6,307,768 B1 * 10/2001 Zimmermann ................. 365/51
6,337,820 B1 *  1/2002 Hatakeyama ................. 365/201

FOREIGN PATENT DOCUMENTS

| JP | 61-126683 | 6/1986 |
| JP | 63-205897 | 8/1988 |
| JP | 11-185481 | 7/1999 |
| JP | 2004-079099 | 3/2004 |

* cited by examiner

*Primary Examiner* — Pho M Luu
*Assistant Examiner* — Thao Bui
(74) *Attorney, Agent, or Firm* — Young & Thompson

(57) ABSTRACT

A semiconductor device includes a first amplifier circuit, a second amplifier circuit, first and second bit lines coupled to the first amplifier circuit, third and fourth bit lines coupled to the second amplifier circuit, a first equalizer circuit being coupled to the first and second bit lines, and a second equalizer circuit being coupled between the second and third bit lines. The second equalizer circuit being closer to the second amplifier circuit than the first equalizer circuit, the first equalizer circuit being closer to the first amplifier circuit than the second equalizer circuit.

9 Claims, 9 Drawing Sheets

SEMICONDUCTOR MEMORY DEVICE

BACKGROUND OF THE INVENTION

1. Field of the Invention

The present invention relates to a semiconductor memory device, and particularly, to a semiconductor memory device precharging a single bit line from a plurality of sites.

Priority is claimed on Japanese Patent Application No. 2009-274494, filed Dec. 2, 2009, the content of which is incorporated herein by reference.

2. Description of the Related Art

In DRAMs (Dynamic Random Access Memories), data are stored by accumulating a charge in a capacitive element, readout of data from a memory cell and writing of data to the memory cell are performed through a bit line. However, particularly in the case of readout, it is necessary to differentially amplify data (memory information) read out from the memory cell using a sense amplifier and the like. For this reason, generally, there is a configuration using two bit lines as one set (bit line pair) and connecting them to input terminals of the sense amplifier, and signals complementary to each other are input to the sense amplifier through the bit line pair.

After the end of access to the memory cell, it is necessary to perform an operation of equalizing the potential of the bit line pair to the same potential level in preparation for next access, or a so-called precharge operation. This is because in a state where a difference occurs in the potential level of the bit line pair, when the memory cell, storing data different from the data of the memory cell previously accessed, in the same bit line is selected in the next access, an offset voltage is input to the sense amplifier, resulting in a malfunction.

On the other hand, since the cycle time of the DRAM is mostly occupied by the access time and the precharge time, it is important to shorten the precharge time of the bit line in order to achieve a shortening of the cycle time. However, in the DRAM, since the load of the bit line is weighted with high integration, the above-mentioned precharge time tends to be increased. Japanese Unexamined Patent Application Publication Nos. S61-126683 and S63-205897, for example, disclose a semiconductor memory device that precharges one bit line at a plurality of sites (including both ends). In addition, Japanese Unexamined Patent Application Publication No. 2004-79099 discloses a semiconductor memory device that precharges a global bit line from both ends thereof, with respect to the two-layer bit line of a local bit line and a global bit line. Japanese Unexamined Patent Application Publication No. H11-185481 discloses a semiconductor memory device including a connection transistor that short-circuits the bit line connected to a different sense amplifier, in other words, the unpaired bit line.

SUMMARY

In one embodiment, a semiconductor device may include, but is not limited to, first and second amplifier circuits, first and second bit lines, third and fourth bit lines, a first equalizer circuit and a second equalizer circuit. The first and second bit lines are each coupled to the first amplifier circuit. The first bit line extends from the first amplifier circuit. The second bit line extends to opposite side to the first bit line with respect to the first amplifier circuit. The third and fourth bit lines are coupled to the second amplifier circuit. The third and fourth bit lines extend from the second amplifier circuit. The fourth bit line extends to opposite side to the third bit line with respect to the second amplifier circuit. The first equalizer circuit is coupled between the first bit line and the second bit line. The second equalizer circuit is coupled between the first bit line and the third bit line.

In another embodiment, a semiconductor device may include, but is not limited to, a first amplifier circuit, a second amplifier circuit, first and second bit lines coupled to the first amplifier circuit, third and fourth bit lines coupled to the second amplifier circuit, a first equalizer circuit being coupled to the first and second bit lines, and a second equalizer circuit being coupled between the second and third bit lines. The second equalizer circuit being closer to the second amplifier circuit than the first equalizer circuit, the first equalizer circuit being closer to the first amplifier circuit than the second equalizer circuit.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Before describing the present invention, the related art will be explained in detail with reference to FIG. 9, in order to facilitate the understanding of the present invention.

In the methods of precharging the bit line disclosed in Japanese Unexamined Patent Application Publication Nos. S61-126683, S63-205897 and 2004-79099, the bit lines are precharged in a state where the bit line pairs (BL,/BL) are independent of each other, that is, in a state where the bit lines are not short-circuited between the paired bit lines between the bit line pairs. For this reason, a difference occurs in the precharge potentials of the bit lines when a precharge period ends, between the bit line pairs, by the variation in parasitic capacitance of the bit line and the like. When a difference occurs in the precharge potentials of the bit lines when the precharge period ends, between the bit line pairs, an offset potential is input to the sense amplifier as described above, and thus data of the memory cell cannot be read out exactly, resulting in the occurrence of a malfunction of reading out erroneous data and the like.

To solve such a problem, for example, there is considered a method of short-circuiting the bit line pairs with each other at the time of precharge to thereby make the potential between the bit line pairs constant. This is called an equalization operation for the bit lines. Here, when the length of the bit line becomes large, it is necessary to cause the potentials to have the same potential along the length direction of the bit line, and to cause the potentials of the bit lines to have the same potential between the bit line pairs. Therefore, it is also necessary to perform a short circuit of the bit lines between the bit line pairs at both ends of the bit line, for example, without performing the short circuit thereof only at a portion of the near end side of the sense amplifier.

Figure 9:
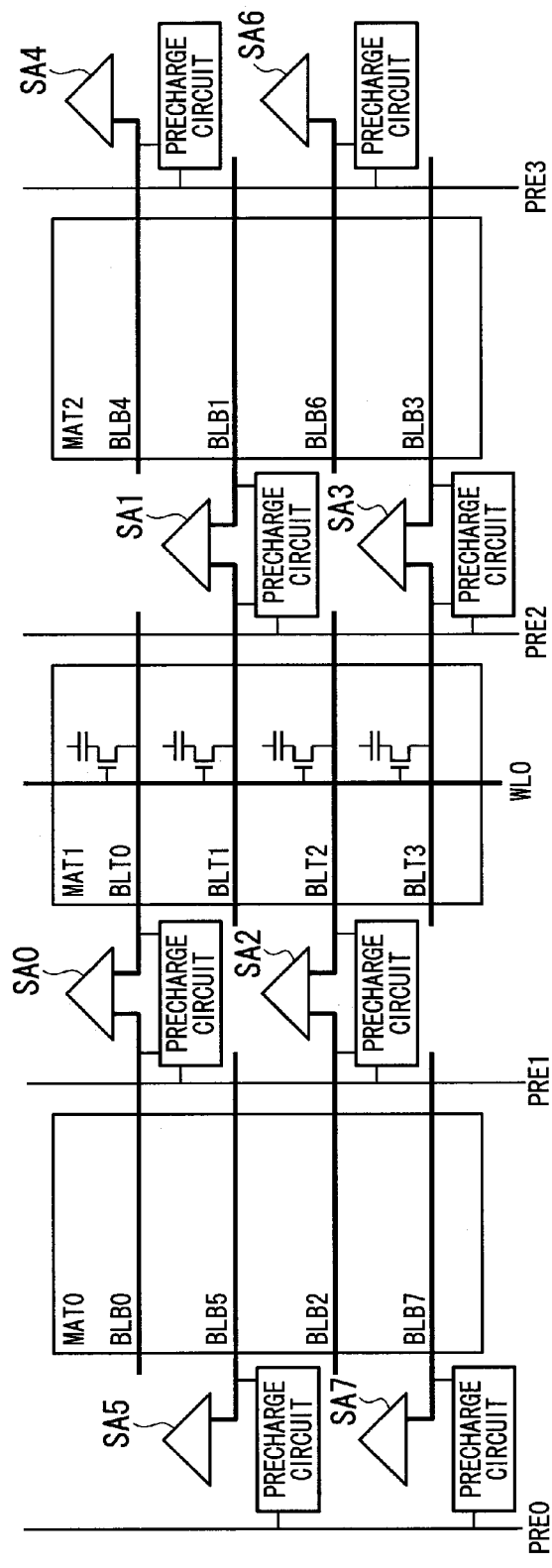
FIG. 9 is a schematic diagram illustrating configurations of a semiconductor device with open bit lines in the related art.

As shown in FIG. 9, in an open bit line-type semiconductor memory device, it is possible to short-circuit the end portions near to the sense amplifiers of each of the bit lines of the bit line pairs (hereinafter, referred to as "near end") with each other. For example, in FIG. 9, it is possible to realize by using a precharge circuit (circuit that equalizes two bit lines to the same potential, and precharges them to the same potential) in order to short-circuit the near end of a bit line BLB0 and the near end of a bit line BLT0, which are connected to a sense amplifier SA0, with each other.

On the other hand, a long-distance interconnection is required to short-circuit the end portions far from the sense amplifiers of each of the bit lines of the bit line pairs (hereinafter, referred to as "far end") with each other. For example, in FIG. 9, long-distance interconnection is required to short-circuit the far end of the bit line BLB0 and the far end of the bit line BLT0. However, when the long-distance interconnection is used in equalizing the bit line pairs, the delay time due to parasitic resistance or parasitic capacitance of the long-distance interconnection increases. As a result, time is required for equalization of the far end, and thus shortening of the precharge time of the bit line is not achieved.

In the open bit line-type semiconductor memory device shown in FIG. 9, it is difficult to short-circuit the far ends of each of the bit lines forming the bit line pairs with each other. Therefore, there has been a problem that the precharge time cannot be shortened and thus speeding up of a cycle cannot be achieved.

Japanese Unexamined Patent Application Publication No. S11-185481 discloses the configuration for connecting the far ends of the bit lines, in which the bit line pairs are not formed, through a connection transistor in a semiconductor memory device having an open bit line structure. This is disclosed in FIG. 12 of Japanese Unexamined Patent Application Publication No. S11-185481. However, since the precharge circuit is not disposed at the far end side of the bit line, and precharge of the bit line is performed only from the near end side of each bit line, the precharge period of the bit line cannot be shortened.

Further, the above-mentioned semiconductor memory device is disclosed in Japanese Unexamined Patent Application Publication No. H11-185481. The above-mentioned semiconductor memory device is designed for alleviating the capacitance variation between the bit line pairs generated by connecting one bit line of the bit line pair to a dummy bit line at the time of data readout. For this reason, since the above-mentioned connection transistor forms a reference voltage, the connection transistor is required for being in a connection state for a predetermined period after rise of the word line. This is disclosed in FIG. 4 and paragraphs [0050] to [0054] of Japanese Unexamined Patent Application Publication No. H11-185481.

Since the connection transistor disclosed in Japanese Unexamined Patent Application Publication No. H11-185481 does not include a precharge circuit for getting rid of a potential difference between the bit line pairs and between the bit lines in which the bit line pair is not formed, it is not considered to have a function of shortening the precharge time.

That is, there has been a problem that the precharge time cannot be shortened even by a technique in Japanese Unexamined Patent Application Publication No. H11-185481, and speeding up of a cycle cannot be achieved.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, first and second amplifier circuits, first and second bit lines, third and fourth bit lines, a first equalizer circuit and a second equalizer circuit. The first and second bit lines are each coupled to the first amplifier circuit. The first bit line extends from the first amplifier circuit. The second bit line extends to opposite side to the first bit line with respect to the first amplifier circuit. The third and fourth bit lines are coupled to the second amplifier circuit. The third and fourth bit lines extend from the second amplifier circuit. The fourth bit line extends to opposite side to the third bit line with respect to the second amplifier circuit. The first equalizer circuit is coupled between the first bit line and the second bit line. The second equalizer circuit is coupled between the first bit line and the third bit line.

In some cases, each of the first and second bit lines is coupled to the first amplifier circuit at one end thereof. Each of the third and fourth bit lines is coupled to the second amplifier circuit at one end thereof. The first equalizer circuit is coupled between the one end of the first bit line and the one end of the second bit line. The second equalizer circuit is coupled between the other end of the first bit line and the one end of the third bit line.

In some cases, the semiconductor device may further include, but is not limited to, first and second areas and a first memory cell mat sandwiched between first and second areas. The first and second areas and the first memory cell mat are arranged in a first direction in which the first bit lines elongate. The first and second amplifier circuits are disposed respectively on the first and second areas.

In some cases, the semiconductor device may further include, but is not limited to, second and third memory cell mats. The second memory cell mat is arranged so that the first area is sandwiched between the first and the second memory cell mats. The third memory cell mat is arranged so that the second area is sandwiched between the first memory cell mat and the third memory cell mat. Each of the first, the second and the third memory cell mats includes a plurality of memory cells. Each of the first and third bit lines is coupled to a corresponding one of the memory cells of first memory cell mat. The second bit line is coupled to a corresponding one of the memory cells of the second memory cell mat. The fourth bit line is coupled to a corresponding one of the memory cells of the third memory cell mat.

In some cases, the semiconductor device may further include, but is not limited to, third and fourth equalizer circuits. The third equalizer circuit is coupled between the one end of the third bit line and the one end of the fourth bit line. The fourth equalizer circuit is coupled between the one end of the first bit line and the other end of the third bit line.

In some cases, the third equalizer circuit may be disposed on the second area and the fourth equalizer circuit is disposed on the first area. In some cases, the semiconductor device may further include, but is not limited to, first and second precharge control circuits. The first precharge control circuit supplies first and second equalize activation signals with the first and second equalizer circuits, respectively. The second precharge control circuit supplies third and fourth equalize activation signals with the third and fourth equalizer circuits, respectively. The first equalizer circuit is activated in response to the first equalize activation signal to precharge the first and second bit lines. The second equalizer circuit is activated in response to the second equalize activation signal to precharge the first and third bit lines. The third equalizer circuit is activated in response to the third equalize activation signal to precharge the third and fourth bit lines. The fourth equalizer circuit is activated in response to the fourth equalize activation signal to precharge the first and third bit lines.

In some cases, the semiconductor device may further include, but is not limited to, a plurality of third amplifier circuits, a plurality of fourth amplifier circuits, a plurality of fifth bit lines, a plurality of sixth bit lines, a plurality of seventh bit lines, a plurality of eighth bit lines, a plurality of third equalizer circuits, and a plurality of fourth equalizer circuits. The plurality of third amplifier circuits may be arranged substantially on a line that passes through the first amplifier circuit and elongates in a first direction crossing the first bit lines. The plurality of fourth amplifier circuits may be arranged substantially on a line that passes through the second amplifier circuit and elongates in the first direction. The plurality of fifth bit lines may be each coupled to a corresponding one of the third amplifier circuits at one end thereof and elongating in parallel to the first bit line. The plurality of sixth bit lines may be each coupled to a corresponding one of the third amplifier circuits at one end thereof and elongating to opposite side to a corresponding one of the fifth bit lines with respect to a corresponding one of the third amplifier circuit in parallel to the second bit line. The plurality of seventh bit lines may be each coupled to a corresponding one of the fourth amplifier circuits at one end thereof and elongating in parallel to the third bit line. The plurality of eighth bit lines may be each coupled to a corresponding one of the fourth amplifier circuits at one end thereof and elongating to opposite side to a corresponding one of the seventh bit lines with respect to a corresponding one of the fourth amplifier circuit in parallel to the second bit line. The plurality of third equalizer circuits may be each coupled between the one end of a corresponding one of the fifth bit lines and the one end of a corresponding one of the sixth bit lines. The plurality of fourth equalizer circuits may be each coupled between the other end of a corresponding one of the fifth bit lines and the one end of a corresponding one of the seventh bit lines.

In another embodiment, a semiconductor device may include, but is not limited to, a first amplifier circuit, a second amplifier circuit, first and second bit lines coupled to the first amplifier circuit, third and fourth bit lines coupled to the second amplifier circuit, a first equalizer circuit being coupled to the first and second bit lines, and a second equalizer circuit being coupled between the second and third bit lines. The second equalizer circuit being closer to the second amplifier circuit than the first equalizer circuit, the first equalizer circuit being closer to the first amplifier circuit than the second equalizer circuit.

In some cases, the first equalizer circuit may be connected to first and second portions of the first and second bit lines, and the first and second portions are connected to the inputs of the first amplifier circuit.

In some cases, the first and second portions of the first and second bit lines may be proximate to the inputs of the first sense amplifier.

In other cases, the second and third bit lines may extend parallel to each other, and the second equalizer circuit is positioned between the second and third bit lines.

In some cases, the semiconductor device may further include, but is not limited to, a memory cell mat column arranged between the first amplifier circuit and the second amplifier circuit.

In some cases, the second equalizer circuit may be closer to the memory cell mat column than the first equalizer circuit.

In other cases, the memory cell mat column may be arranged between the second equalizer circuit and the second amplifier circuit.

In some cases, the semiconductor device may further include, but is not limited to, a third equalizer circuit being coupled to the third and fourth bit lines; and a fourth equalizer circuit being coupled between the second and third bit lines. The fourth equalizer circuit is closer to the memory cell mat column than the third equalizer circuit.

The third equalizer circuit is closer to the second amplifier circuit than the fourth equalizer circuit.

In some cases, the memory cell mat column may be arranged between the second and fourth equalizer circuits.

In other cases, the third equalizer circuit may be connected to third and fourth portions of the third and fourth bit lines. The third and fourth portions may be connected to the inputs of the second amplifier circuit.

In some cases, the third and fourth portions of the third and fourth bit lines may be proximate to the inputs of the second sense amplifier.

In some cases, the second and third bit lines may extend parallel to each other. The fourth equalizer circuit may be positioned between the second and third bit lines.

Embodiments

Hereinafter, preferred embodiments according to the invention will be described in detail with reference to the accompanying drawings.

Figure 1:
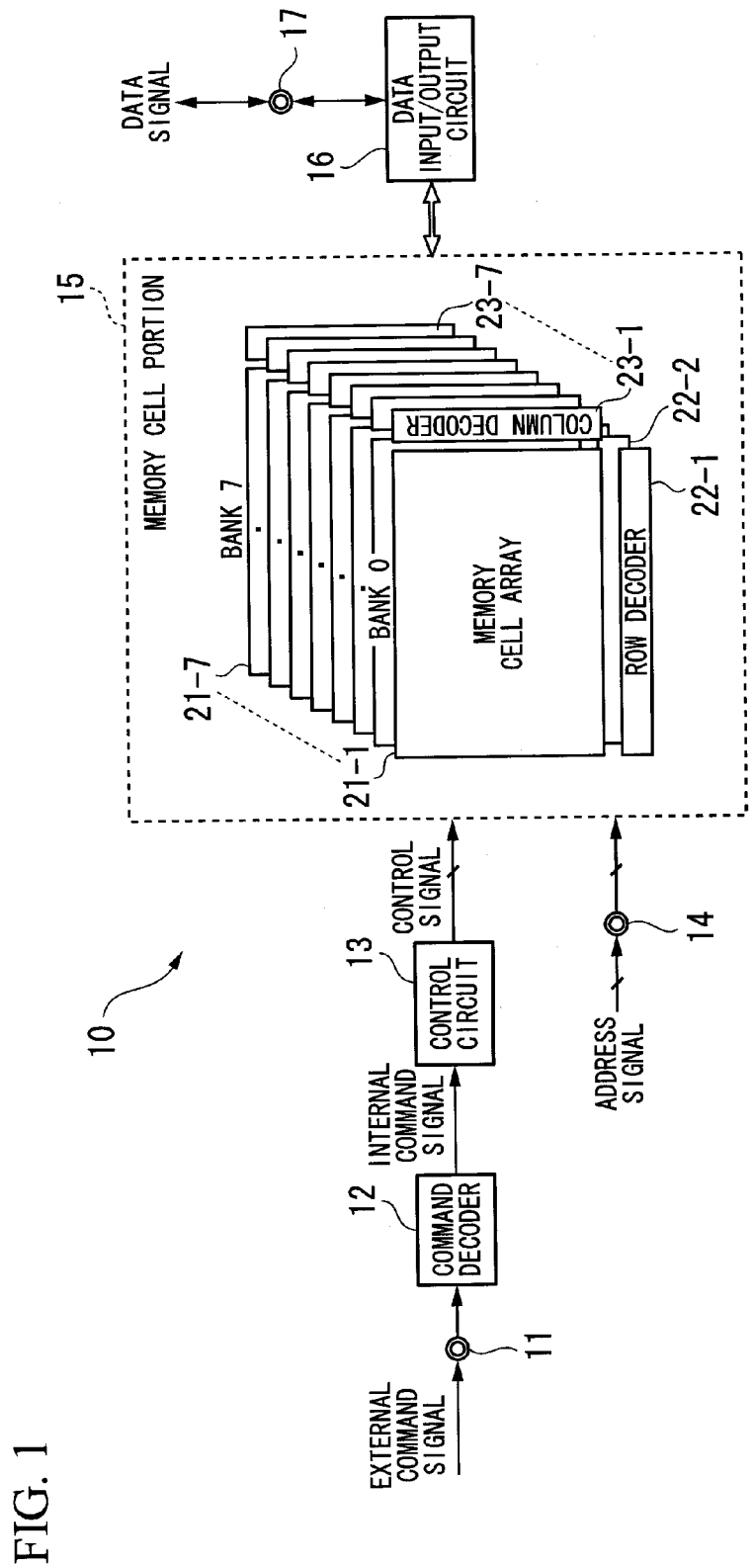
FIG. 1 is a schematic view illustrating configurations of a semiconductor device in accordance with a preferred embodiment of the present invention.

FIG. 1 is a block diagram illustrating a semiconductor memory device 10 according to a first embodiment.

The semiconductor memory device 10 according to the embodiment includes a command terminal 11, a command decoder 12, a control circuit 13, an address terminal 14, a memory cell portion 15, a data input/output circuit 16, and a data terminal 17.

The command decoder 12 decodes external command signals for directing readout, writing and the like which are input from the outside through the command terminal 11 to generate internal command signals, and outputs the signals to the control circuit 13.

The control circuit 13 receives the internal command signals from the command decoder 12, and outputs control signals in response to each of the external commands to a plurality of circuits within the memory cell portion 15.

When the semiconductor memory device 10 performs a readout operation, the data input/output circuit 16 receives readout data from the memory cell portion 15, and outputs the input readout data to the outside through the data terminal 17. In addition, when the semiconductor memory device 10 performs a writing operation, the data input/output circuit 16 receives writing data from the outside through the data terminal 17, and supplies the input writing data to the memory cell portion 15.

The memory cell portion 15 includes a plurality of banks k, where k=0 to 7 in the embodiment. Each of the banks k includes memory cell arrays 21-k, row decoders 22-k and column decoders 23-k.

The row decoder 22-k receives control signals in response to active commands which are input from the outside through the command terminal 11, and row addresses input from the outside through the address terminal 14 together with the active commands, and outputs word line selection signals to a word line driving circuit described later. The word line driving circuit selects word lines within the memory cell arrays corresponding to these row addresses.

The column decoders 23-k receives control signals in response to read commands or write commands which are input from the outside through the command terminal 11, and column addresses input from the outside through the address terminal 14 together with the read commands or the write commands, and connects bit lines within the memory cell arrays corresponding to these column addresses and the data input/output circuit 16.

Figure 2:
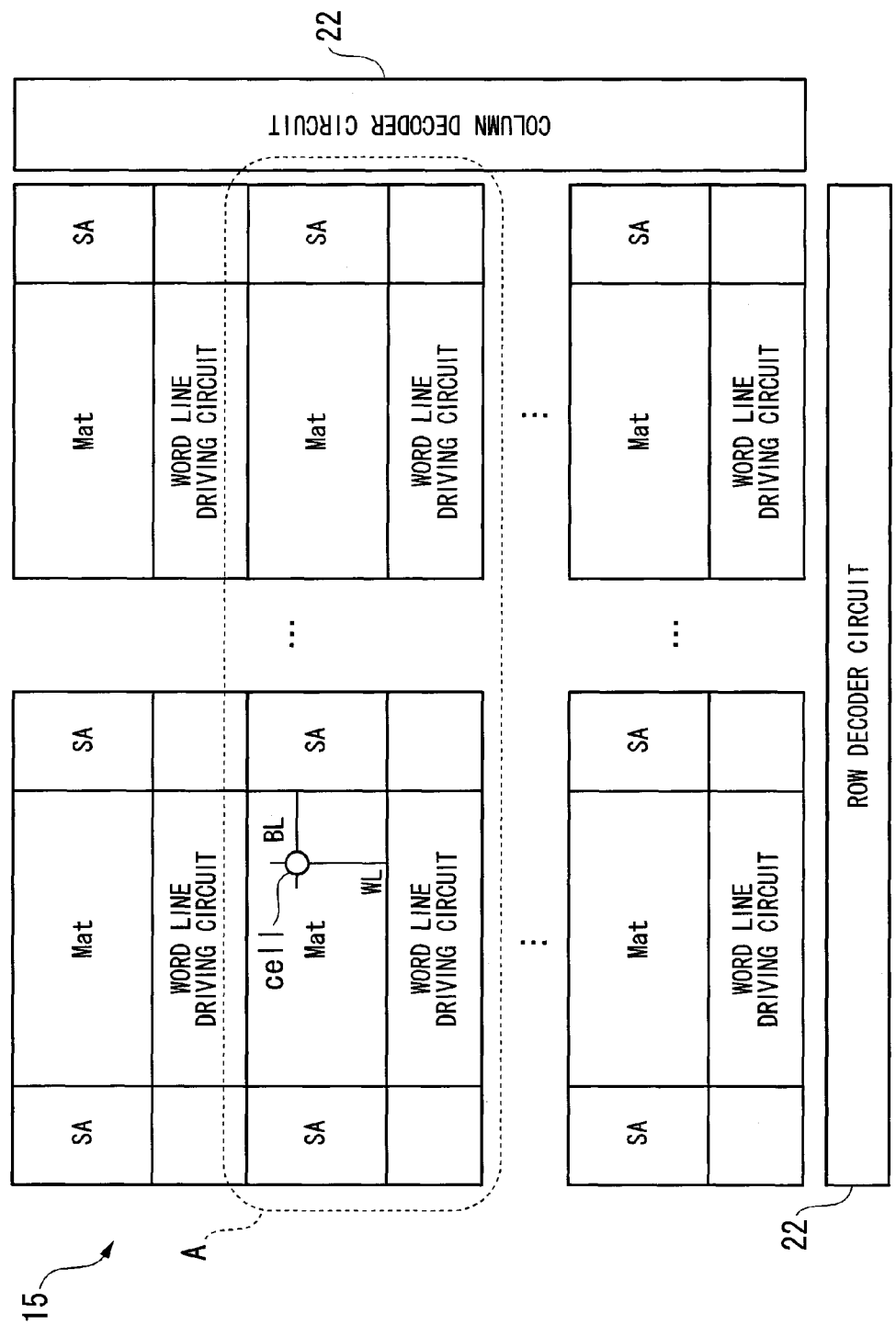
FIG. 2 is a schematic diagram illustrating configurations of a memory cell array in one bank in the semiconductor device of FIG. 1.
Figure 3:
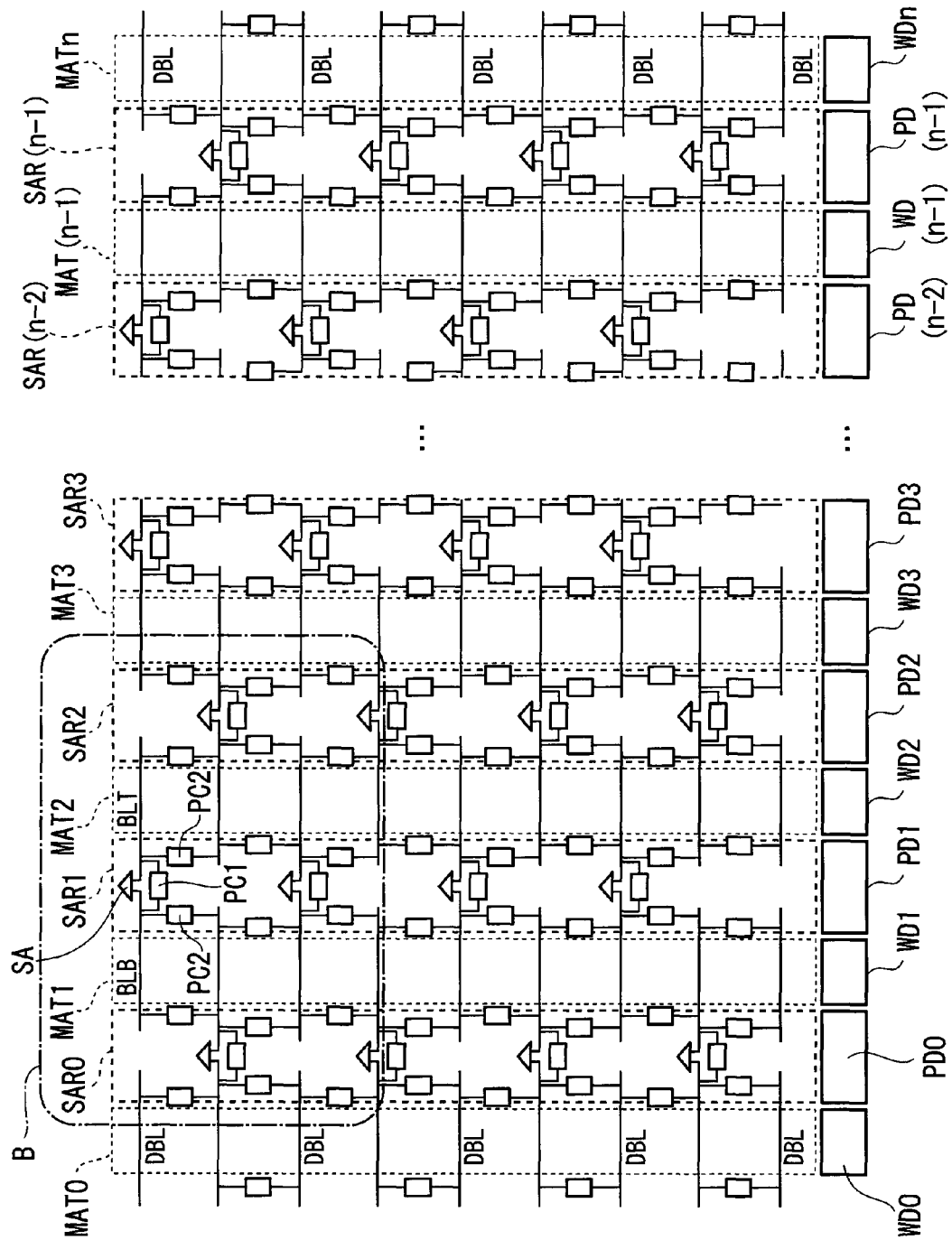
FIG. 3 is a diagram illustrating a first part "A" of the configurations of the memory cell array of FIG. 2.
Figure 4:
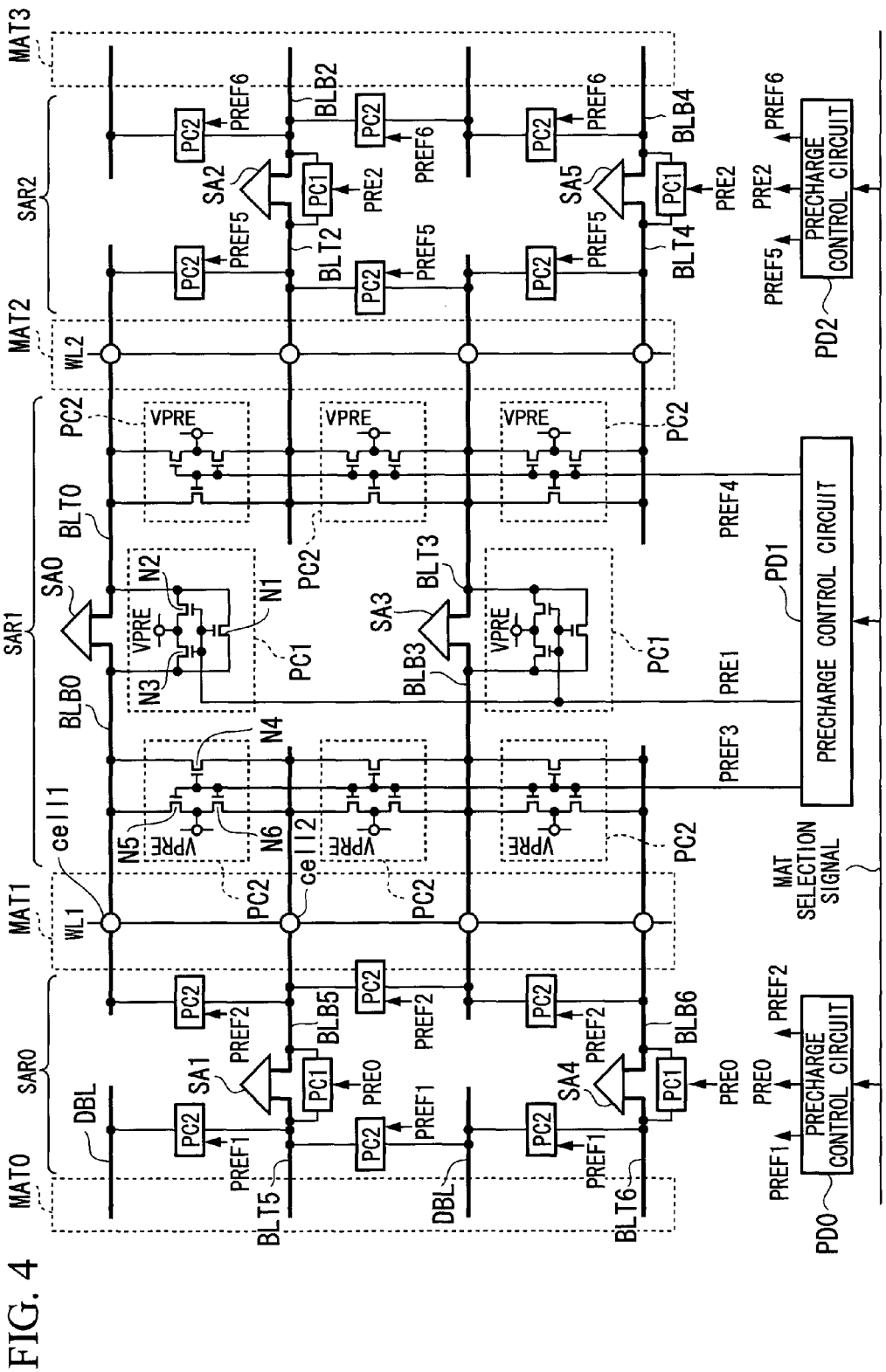
FIG. 4 is a diagram illustrating a second part "B" of the configurations of the memory cell array of FIG. 2.

Hereinafter, the memory cell arrays which are characteristic of the invention will be described with reference to FIGS. 2 to 4. FIG. 2 is a schematic view illustrating the configuration of the memory cell portion 15 in one bank shown in FIG. 1. In addition, FIG. 3 is a schematic view illustrating part A shown in FIG. 2 in detail, and FIG. 4 is a schematic view illustrating part B shown in FIG. 3 in more detail.

As shown in FIG. 2, the memory cell portion 15 includes a plurality of sense amplifier regions SA, a plurality of word line driving circuits, and a plurality of memory cell mats (Mat).

A plurality of sense amplifier circuits connected to bit line pairs is disposed at the sense amplifier region SA.

A plurality of word lines WL connected to the adjacent disposed word line driving circuit, and a plurality of bit lines BL connected to any one of the sense amplifier regions SA adjacent to each other are disposed in parallel with each other at the memory cell mat (Mat), and each of the memory cells cell is disposed at the intersection of the bit line BL and the word line WL.

As shown in FIG. 3, part A in FIG. 2 includes a plurality of memory cell mat columns MATi (i=0 to n), a plurality of sense amplifier columns SARi (i=0 to n−1), a plurality of word line driving circuits WDi (i=0 to n), and a plurality of precharge control circuits PDi (i=0 to n−1).

In FIG. 3, each of a plurality of word line driving circuits WDi is respectively provided corresponding to the memory cell mat columns MATi. In addition, the word line driving circuits WDi activate the word lines corresponding to the word line selection signals supplied from the row decoder circuits. Thereby, the memory cell mat columns MATi are activated. Here, in a one-time writing operation or readout operation, one memory cell mat column of a plurality of memory cell mat columns MATi (i=0 to n) shown in FIG. 3 is selectively activated, and the remaining memory cell mat columns are inactivated. That is, one word line in one memory cell mat column is selected among the (n+1) memory cell mat columns, and the memory cell mat column is activated. The other n memory cell mat columns are not activated.

The sense amplifier column SARi includes a plurality of sense amplifier circuits SA, a plurality of first precharge circuits PC1 and second precharge circuits PC2.

In addition, as shown in FIG. 3, each of a plurality of precharge control circuits PDi (i=1 to n−1) is respectively provided corresponding to the sense amplifier columns SARi. The precharge control circuit PDi is controlled by control signals which the control circuit 13 outputs in response to the active commands input from the outside through the command terminal 11, and mat selection signals which the control circuit 13 outputs in response to precharge commands input from the outside through the command terminal 11. The precharge control circuit switches the active or inactive states of a plurality of first precharge circuits PC1 and second precharge circuits PC2 disposed within the corresponding sense amplifier columns SARi.

Meanwhile, although the sense amplifier driving circuits for driving the sense amplifier circuits SA included in the sense amplifier column SARi are omitted in FIGS. 3 and 4, the sense amplifier driving circuits activate the sense amplifier circuits SA by the control signals which the control circuit 13 outputs in response to the active commands input from the outside through the command terminal 11, after the lapse of a predetermined period of time from the time at which the word line is selected. The sense amplifier circuit SA is activated to thereby amplify a difference potential between the connected bit line pairs, raises the potential of the bit line of the H level side up to a power supply potential (set to a power supply potential level Vc) of the memory cell array, and lowers the potential of the bit line of the L level side up to a ground potential (0 V).

In addition, in the semiconductor memory device 10 of the invention, the memory cell array has an open bit type configuration. In other words, two bit lines BLT and BLB connected to one sense amplifier (for example, sense amplifier SA belonging to the sense amplifier column SAR1) belong to the memory cell mats (for example, memory cell mat columns MAT1 and MAT2), differing from each other, which are disposed with the sense amplifier column interposed therebetween, and receive or output signals complementary to each other.

In addition, in the semiconductor memory device of the invention, the sense amplifiers are alternately disposed in an extension direction of the word line. To explain this disposition with reference to FIG. 4, the bit lines belonging to the memory cell mat column MAT1 are disposed in the order of a bit line BLB0, a bit line BLB5, a bit line BLB3, a bit line BLB6, . . . , as viewed from the far side of the precharge control circuits (that is, from the upper side of the drawing). A sense amplifier SA0 connected to the bit line BLB0, and a sense amplifier SA3 connected to the bit line BLB3 are disposed at the sense amplifier column SAR1. On the other hand, a sense amplifier SA1 connected to the bit line BLB5, and a sense amplifier SA4 connected to the bit line BLB6 are disposed at the sense amplifier column SAR0. In other words, the sense amplifier SA0 and the sense amplifier SA1, the sense amplifier SA1 and the sense amplifier SA3, and the sense amplifier SA3 and the sense amplifier SA4 are respectively disposed alternately at the different sense amplifier columns. More generally, explained with reference to FIG. 3, in a plurality of bit lines adjacently disposed from the far side of the word line driving circuit WDi to the near side thereof in the memory cell mat column MATi, the odd-numbered bit line is connected to the sense amplifier of the sense amplifier column SARi when i is an odd number, and is connected to the sense amplifier of the sense amplifier column SAR (i−1) when i is an even number. In addition, the even-numbered bit line is connected to the sense amplifier of the sense amplifier column SAR (i−1) when i is an odd number, and is connected to the sense amplifier of the sense amplifier column SARi when i is an even number. That is, in the memory cell mat column MATi, the sense amplifier connected to the odd-numbered bit line, and the sense amplifier connected to the even-numbered bit line are the sense amplifiers within the sense amplifier columns which are adjacent to each other in the bit line direction.

Meanwhile, by such a disposition, the distance (distance between the centers, or a sense amplifier pitch) between two sense amplifiers which are adjacent to each other along the extension direction of the word line is two times the distance (distance between the centers, or a bit line pitch) between two bit lines which are adjacent to each other along the extension direction of the word line. For example, in FIG. 4, the pitch between the sense amplifier SA0 and the sense amplifier SA3 belonging to the sense amplifier column SAR1 is two times the pitch between the bit line BLB0 and the bit line BLB5. In addition, in two sense amplifier columns which are adjacent to each other with one memory cell mat interposed therebetween, the sense amplifiers are disposed separated by a bit line pitch with respect to the extension direction of the word line.

In this way, two bit lines which are adjacent to each other along the extension direction of the word line are connected to the sense amplifiers disposed at the sense amplifier columns different from each other, and the memory cell array forms an open bit type cell array shown in FIGS. 3 and 4.

Here, the configuration of the first precharge circuit PC1 will be described by taking, as an example, the precharge circuit provided corresponding to the sense amplifier SA0 in FIG. 4. Meanwhile, in FIGS. 3 and 4, all of the precharge circuits PC1 have the same configuration, and the precharge circuits PC1 belonging to the same sense amplifier column SARi are activated or inactivated by the same control signal (mat selection signal).

The first precharge circuit PC1 includes three transistors of N-channel type MOS transistors N1 to N3 as shown in FIG. 4. A gate terminal of the N-channel type MOS transistor N1 is connected to a precharge control circuit PD1, and a first precharge signal PRE1 is input to the gate terminal. In addition, one of a source terminal or a drain terminal is connected to the bit line BLB0, and the other is connected to the bit line BLT0. Here, the bit line BLB0 and the bit line BLT0 are bit lines which form a bit line pair to be connected to the sense amplifier SA0.

By such a configuration, when the first precharge signal PRE1 reaches an H level at the time of precharge of the bit line, the N-channel type MOS transistor N1 short-circuits the bit line BLB0 and the bit line BLT0, and equalizes the potentials of the two bit lines to the same potential.

A gate terminal of the N-channel type MOS transistor N2 is connected to the precharge control circuit PD1, and the first precharge signal PRE1 is input to the gate terminal. In addition, one of a source terminal or a drain terminal is connected to the bit line BLT0, and the other is connected to a precharge potential supply line. Here, the precharge potential supply line is connected to a power generating circuit which is not shown in FIG. 4, and a precharge potential level (set to a precharge potential level VPRE), for example, a potential level ½ times the power supply potential level Vc is supplied thereto from the power generating circuit.

In addition, a gate terminal of the N-channel type MOS transistor N3 is connected to the precharge control circuit PD1, and the first precharge signal PRE1 is input to the gate terminal. In addition, one of a source terminal or a drain terminal is connected to the bit line BLB0, and the other is connected to the precharge potential supply line.

By such a configuration, when the first precharge signal PRE1 reaches an H level at the time of precharge of the bit line, the N-channel type MOS transistors N2 and N3 short-circuits the bit line BLB0 and the bit line BLT0, equalizes the potentials of the two bit lines to the same potential, and further precharges the potential of both bit lines to the precharge potential level VPRE.

Therefore, when the first precharge signal PRE1 reaches an H level at the time of precharge of the bit line, the first precharge circuit PC1 equalizes (sets to the same potential) the bit line BLB0 and the bit line BLT0 by the N-channel type MOS transistor N1, and the N-channel type MOS transistors N2 and N3, and precharges them to the precharge potential level VPRE by the N-channel type MOS transistors N2 and N3.

The configuration of the second precharge circuit PC2 will be described by taking, as an example, the precharge circuit provided corresponding to the sense amplifier SA0 in FIG. 4. Meanwhile, in FIGS. 3 and 4, although all of the precharge circuits PC2 have the same configuration, the precharge circuits PC2 provided at the right and left sides, among the precharge circuits PC2 belonging to the same sense amplifier column SARi, with the sense amplifier interposed therebetween are activated or inactivated by different control signals (mat selection signals). For example, in FIG. 4, the second precharge circuit PC2 provided at the left side of the sense amplifier column SAR1 is activated or inactivated by a second precharge signal PREF3, and the second precharge circuit PC2 provided at the right side thereof is activated or inactivated by a second precharge signal PREF4.

The configuration of the second precharge circuit PC2 will be described by taking, as an example, the precharge circuit provided at the left side of the sense amplifier SA0.

The second precharge circuit PC2 includes three transistors of N-channel type MOS transistors N4 to N6 as shown in FIG. 4. A gate terminal of the N-channel type MOS transistor N4 is connected to the precharge control circuit PD1, and the second precharge signal PREF3 is input to the gate terminal. In addition, one of a source terminal or a drain terminal is connected to the near end (one end of the first bit line) of the bit line BLB0, and the other is connected to the far end (the other end of the third bit line) of the bit line BLB5. Here, the bit line BLB0 and the bit line BLT0 are bit lines which form a bit line pair to be connected to the sense amplifier SA0, and the bit line BLB5 and the bit line BLT5 are bit lines which form a bit line pair to be connected to the sense amplifier SA1. That is, the bit line BLB0 and the bit line BLB5 have a relationship where the near end (one end) of the bit line BLB0 and the far end (the other end) of the bit line BLB5 are adjacent to each other, the far end (the other end) of the bit line BLB0 and the near end (one end) of the bit line BLB5 are adjacent to each other, and are extended parallel to each other.

Using such a configuration, when the second precharge signal PREF3 reaches an H level at the time of precharge of the bit line, the N-channel type MOS transistor N4 short-circuits the near end of the bit line BLB0 and the far end of the bit line BLB5, and equalizes the potentials of the two bit lines to the same potential.

In addition, a gate terminal of the N-channel type MOS transistor N5 is connected to the precharge control circuit PD1, and the second precharge signal PREF3 is input to the gate terminal. In addition, one of a source terminal or a drain terminal is connected to the near end of the bit line BLB0, and the other is connected to the above-mentioned precharge potential supply line (precharge potential level VPRE).

In addition, a gate terminal of the N-channel type MOS transistor N6 is connected to the precharge control circuit PD1, and the second precharge signal PREF3 is input to the gate terminal. In addition, one of a source terminal or a drain terminal is connected to the far end of the bit line BLB5, and the other is connected to the precharge potential supply line.

By such a configuration, when the second precharge signal PREF3 reaches an H level at the time of precharge of the bit line, the N-channel type MOS transistors N5 and N6 short-circuit the near end of the bit line BLB0 and the far end of the bit line BLB5, equalize the potentials of the two bit lines to the same potential, and further precharge the potentials of both bit lines to the precharge potential level VPRE.

Therefore, when the second precharge signal PREF3 reaches an H level at the time of precharge of the bit line, the second precharge circuit PC2 equalizes (sets to the same potential) the far end of the bit line BLB0 and the far end of the bit line BLB5 by the N-channel type MOS transistor N4, and the N-channel type MOS transistors N5 and N6, and precharges them to the precharge potential level VPRE by the N-channel type MOS transistors N5 and N6.

As seen from the above, the precharge control circuit PDi shown in FIG. 3 supplies the first precharge signal PREi to the first precharge circuit PC1 within the sense amplifier column SARi to thereby control the active or inactive state of the first precharge circuit PC1. In addition, the precharge control circuit PDi supplies the second precharge signals PREF(i×2+1) and PREF(i×2+2) to the second precharge circuit PC2 located at the left side and the second precharge circuit PC2 located at the right side within the sense amplifier column SARi, respectively, to thereby control the active or inactive state of the second precharge circuit PC2.

Here, the active and inactive states of the memory cell mat column MATi, the sense amplifier column SARi, the first precharge circuit PC1 and the second precharge circuit PC2, shown in FIG. 3, have the following relationship.

When the memory cell mat column MATi is activated, that is, when the word line WL within the memory cell mat column MATi is selected, after the lapse of a predetermined period of time, the sense amplifier columns SAR(i−1) and SAR(i) with the memory cell mat column MATi interposed therebetween are activated, and the sense amplifier within the sense amplifier column performs an amplification operation.

In addition, before the word line WL within the memory cell mat column MATi is selected, the first precharge circuit PC1 and the second precharge circuit PC2 within the sense amplifier column SAR(i−1) and the sense amplifier column SAR(i) shift from the active state to the inactive state. This is to terminate a precharge time, to perform an amplification operation through the sense amplifier, and to float the potentials of each of the bit lines.

In addition, the second precharge circuit PC2 (of the SAR (i−1) side) located at the right side within the sense amplifier column SAR(i−2) also shifts from the active state to the inactive state. This is to electrically disconnect the bit lines within the memory cell mat column MAT(i−1) from each other.

In addition, the second precharge circuit PC2 (of the SAR (i) side) located at the left side within the sense amplifier column SAR(i+1) also shifts from the active state to the inactive state. This is to electrically disconnect the bit lines within the memory cell mat column MAT(i+1) from each other. Meanwhile, the first precharge circuit PC1 and the second precharge circuit PC2 which are activated shift from the inactive state to the active state at the time of precharge.

Meanwhile, in a period at which the memory cell mat column MATi is activated, the other memory mats are not activated. In addition, even in a period at which the memory cell mat column MATi is activated, the first precharge circuit PC1 and the second precharge circuit PC2 other than the above maintain the active state, and maintain the potential of the connected bit line at the precharge potential level VPRE.

Figure 5:
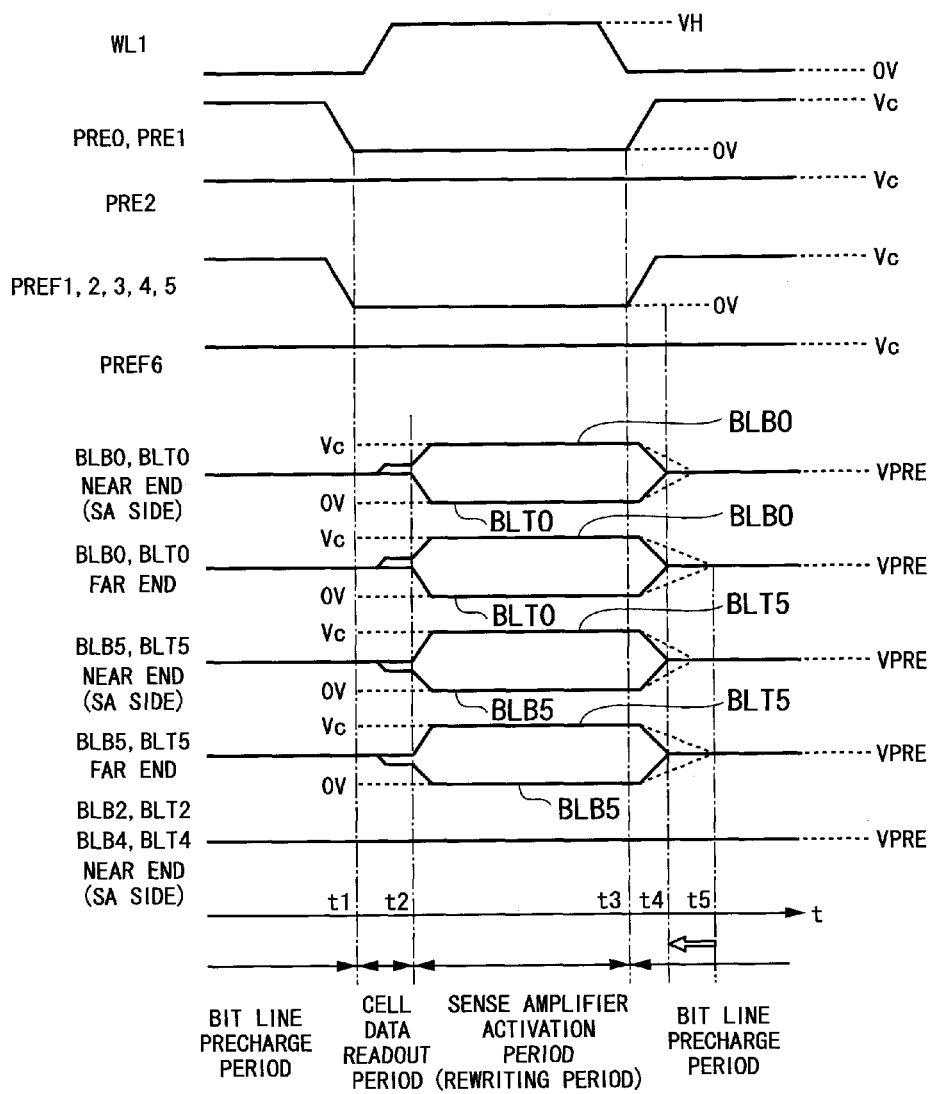
FIG. 5 is a timing chart illustrating bit line precharge operations of the configuration shown in FIG. 4.

FIG. 5 is a timing diagram illustrating an activation operation of the precharge circuit and a potential change in the bit line at the time of precharge, when the word line WL1 in FIG. 4 is selected and the memory cell mat column MAT1 is activated.

In the semiconductor memory device 10, when the active command is input from the outside through the command terminal 11, one memory cell mat column (memory cell mat column MAT1 shown in FIG. 4) is activated by address information that several bits in the row address to be input from the outside through the address terminal 14 indicate together with the active command.

First, in time t1, the precharge control circuits PD0 to PD(n−1) activate the memory cell mat column MAT1. Therefore, when the mat selection signal is input from the control circuit 13, the precharge control circuits change a plurality of first precharge circuits PC1 and second precharge circuits PC2 disposed within a plurality of sense amplifier columns including the sense amplifier columns SAR0 and SAR1 corresponding to the memory cell mat column MAT1 from the active state to the inactive state.

Particularly, in time t1, the precharge control circuit PD1 changes the first precharge signal PRE1, and the second precharge signals PREF3 and PREF4 from the H level to the L level, and sets the first precharge circuit PC1 and the second precharge circuit PC2 within the sense amplifier column SAR1 to be in the inactive state.

In addition, the precharge control circuit PD2 maintains a first precharge signal PRE2 and a second precharge signal PREF6 at the H level. Thereby, the first precharge circuit PC1 and the second precharge circuit PC2 to which the second precharge signal PREF6 is input, which are located within the sense amplifier column SAR2, maintain the active state. On the other hand, the precharge control circuit PD2 changes a second precharge signal PREF5 from the H level to the L level. Thereby, the second precharge circuit PC2 within the sense amplifier column SAR2 to which the second precharge signal PREF5 is input is inactivated.

In addition, the precharge control circuit PD0 changes the first precharge signal PRE0, and the second precharge signals PREF1 and PREF2 from the H level to the L level. Thereby, the first precharge circuit PC1 and the second precharge circuit PC2 within the sense amplifier column SAR0 are inactivated.

In this way, the bit lines within the memory cell mat column MAT1, and the bit lines within the memory cell mat columns MAT0 and MAT2 pairing with these bit lines are electrically disconnected to the adjacent bit lines, and prepare for a sense operation. That is, the potentials of each of the bit lines of the bit line pairs (BLB0, BLT0) and (BLB5, BLT5) are floated at a level having the same potential as that of the precharge potential level VPRE.

The word line driving circuit WD1 sets the word line WL1 to the H level (shown by a pressure-rising potential level VH in FIG. 5), and activates the memory cell mat column MAT1. Thereby, the potential of the bit line BLB0 changes from the precharge potential level VPRE to the H level side. FIG. 5 shows a case where a memory cell cell stores data of the H level. In addition, the potential of the bit line BLB5 changes from the precharge potential level VPRE to the L level side. FIG. 5 shows a case where a memory cell cell12 stores data of the L level. This period is shown as a "cell data readout period" in FIG. 5.

Time t2 to t3 is a "sense amplifier activation period (rewriting period)", and a period in which the difference potential between the bit line pairs is amplified and the level of the memory cell is restored. Such a period is terminated by setting the word line WL 1 to the L level, and shifts to the bit line precharge period at time t3.

At time t3, the precharge control circuit PD 1 changes the first precharge signal PRE1, and the second precharge signals PREF3 and PREF4 from the L level to the H level. Thereby, the first precharge circuit PC1 and the second precharge circuit PC2 within the sense amplifier column SAR1 are activated.

In addition, the precharge control circuit PD2 changes the second precharge signal PREF5 from the L level to the H level. Thereby, the second precharge circuit PC2 within the sense amplifier column SAR2 to which the second precharge signal PREF5 is input is activated.

In addition, the precharge control circuit PD0 changes the first precharge signal PRE0, the second precharge signals PREF1 and PREF2 from the L level to the H level. Thereby, the first precharge circuit PC1 and the second precharge circuit PC2 within the sense amplifier column SAR0 are activated.

In this way, the first precharge circuit PC1 within the sense amplifier column SAR1 is activated by the change of the first precharge signal PRE1 supplied from the corresponding precharge control circuit PD1 to the H level. The first precharge circuit short-circuits the bit line pairs (BLB0, BLT0) and (BLB3, BLT3) connected to the sense amplifiers SA0, SA3, . . . , and precharges the potentials of each of the bit lines to the precharge potential level VPRE.

In addition, the first precharge circuit PC1 within the sense amplifier column SAR0 is activated by the change of the first precharge signal PRE0 supplied from the corresponding precharge control circuit PD0 to the H level. The first precharge circuit short-circuits the bit line pairs (BLB5, BLT5) and (BLB6, BLT6) connected to the sense amplifiers SA1, SA4, . . . , and precharges the potentials of each of the bit lines to the precharge potential level VPRE.

Meanwhile, in all of the first precharge circuit PC1 other than the above, the sense amplifiers within the sense amplifier column do not operate. Therefore, even while the memory cell mat column MAT1 is activated, the first precharge signal PREi (in this case, i is a number other than 0 and 1) is maintained at the H level, and the potential of the corresponding bit line is maintained at the precharge potential level VPRE. For example, while the memory cell mat column MAT1 is activated, the first precharge circuit PC1 within the sense amplifier column SAR2 short-circuits the bit line pairs (BLB2, BLT2) and (BLB4, BLT4) connected to the sense amplifier SA2, SA5, . . . , and fixes the potentials of each of the bit lines to the precharge potential level VPRE.

In addition, the second precharge circuit PC2 within the sense amplifier column SAR1 is activated by the change of the second precharge signals PREF3 and PREF4 supplied from the corresponding precharge control circuit PD1 to the H level. The second precharge circuit short-circuits the bit line pair (BLB0, BLT0), and a plurality of bit lines (BLB5, BLB3, BLB6, . . . , and BLT2, BLT3, BLT4, . . . ) which is adjacent to this bit line pair in the extension direction of the word line to equalize them, and precharges them to the precharge potential level VPRE. In other words, the second precharge circuit PC2 within the sense amplifier column SAR1 to which the second precharge signal PREF3 is input short-circuits the far end portions of the bit lines BLB5, BLB6, . . . connected to the sense amplifier column SAR0, and the near end portions of the bit lines BLB0, BLB3, . . . connected to the sense amplifier column SAR1 to equalize them, and precharges them to the precharge potential level VPRE. In addition, the second precharge circuit PC2 within the sense amplifier column SAR1 to which the second precharge signal PREF4 is input short-circuits the far end portions of the bit lines BLT2, BLT4, . . . connected to the sense amplifier column SAR2, and the near end portions of the bit lines BLT0, BLT3, . . . connected to the sense amplifier column SAR1 to equalize them, and precharges them to the precharge potential level VPRE.

In addition, the second precharge circuit PC2 within the sense amplifier column SAR0 is activated by the change of the second precharge signals PREF1 and PREF2 supplied from the corresponding precharge control circuit PD0 to the H level. The second precharge circuit short-circuits the bit line pair (BLB5, BLT5), and a plurality of bit lines (DBL, DBL, BLT6, . . . from the upper portion of the drawing, and BLB0, BLB3, BLB6, . . . from the upper portion of the drawing) which is adjacent to this bit line pair in the extension direction of the word line to equalize them, and precharges them to the precharge potential level VPRE. In other words, the second precharge circuit PC2 within the sense amplifier column SAR0 to which the second precharge signal PREF2 is input short-circuits the far end portions of the bit lines BLB0, BLB3, . . . connected to the sense amplifier column SAR1, and the near end portions of the bit lines BLB5, BLB6, . . . connected to the sense amplifier column SAR0 to equalize them, and precharges them to the precharge potential level VPRE. In addition, the second precharge circuit PC2 within the sense amplifier column SAR0 to which the second precharge signal PREF1 is input short-circuits the far end portions of the dummy bit lines DBL, DBL, . . . , and the near end portions of the bit lines BLT5, BLT6, . . . connected to the sense amplifier column SAR0 to equalize them, and precharges them to the precharge potential level VPRE. Meanwhile, the dummy bit line is, for example, a bit line of which the potential is fixed to the precharge potential level VPRE.

In addition, the second precharge circuit PC2 within the sense amplifier column SAR2 to which the second precharge signal PREF5 is input is activated by the change of the second precharge signal PREF5 supplied from the corresponding precharge control circuit PD2 to the H level. The second precharge circuit short-circuits the far end portions of the bit lines BLT0, BLT3, . . . connected to the sense amplifier column SAR1, and the near end portions of the bit lines BLT2, BLT4, . . . connected to the sense amplifier column SAR2 to equalize them, and precharges them to the precharge potential level VPRE.

In addition, the second precharge circuit PC2 disposed at the left side (far side when viewed from the sense amplifier column SAR0) of the memory cell mat column MAT0 in FIG. 3 is activated by the change of the second precharge signal PREF1 supplied from the corresponding precharge control circuit (for example, precharge control circuit PD0) to the H level. The second precharge circuit short-circuits the far end portions of the bit lines BLT5, BLT6, . . . connected to the sense amplifier column SAR0, and the dummy bit lines of which the potentials are fixed to equalize them, and precharges them to the precharge potential level VPRE.

Meanwhile, in all of the second precharge circuits PC2 other than the above, the sense amplifiers within the sense amplifier column do not operate. Therefore, even while the memory cell mat column MAT1 is activated, the second precharge signal PREFj (in this case, j is a number other than 1 to 5) is maintained at the H level, the potential of the corresponding bit line is maintained at the precharge potential level VPRE. For example, the second precharge circuit PC2 within the sense amplifier column SAR2 to which the second precharge signal PREF6 is input short-circuits the bit lines within the memory mat column MAT3 while the memory cell mat column MAT1 is activated, and fixes the potentials of each of the bit lines to the precharge potential level VPRE.

In such a precharge operation, focusing on the bit line pair (BLB0, BLT0), the far end of the bit line BLB0 is connected to the near end of the bit line BLB5 by the precharge circuit PC2, and the far end of the bit line BLT0 is connected to the near end of the bit line BLT2 by the precharge circuit PC2, to thereby cause the precharge time difference between the far end and the near end of the bit line to be shortened. In addition, since the charges which are charged to the bit lines of the inactivated memory mat MAT3, and DBL in MAT0 are supplied through PC1 and PC2, the precharge time is further shortened.

As seen from the above, the semiconductor memory device according to the embodiment includes the first and second amplifiers (SA0, SA1), the first bit line pair (BLB0, BLT0) that extends, setting the input ends of the first amplifier (SA0) as one end, to the other ends in opposing directions to each other, the second bit line pair (BLB5, BLT5) that extends, setting the input ends of the second amplifier (SA1) as one end, to the other ends in opposing directions to each other, the first equalization circuit (precharge circuit PC1 within the sense amplifier columns SAR0 and SAR1) that connects the ends of the first bit line pair to each other, the second equalization circuit (precharge circuit PC2 of the BLB0 side within the sense amplifier column SAR1 and the BLB5 side within the sense amplifier column SAR0) that connects the other end of one bit line of the second bit line pair and one end of one bit line of the first bit line pair.

Hereby, in the semiconductor memory device including the open bit line-type memory cell portion, the invention is to precharge each of the bit lines within the memory cell mat (memory cell mat column MAT1) to which the selected word line belongs from both the near end and the far end of the sense amplifier by the precharge circuits (precharge circuits PC1 and PC2) belonging to the sense amplifier columns (sense amplifier columns SAR1 and SAR2) disposed adjacent to the memory cell mat, thereby allowing the precharge time of the bit line to be shorten.

Further, the semiconductor memory device of the invention is configured such that at the time of precharge, the bit lines belonging to the above-mentioned memory cell mat, and all the bit lines belonging to two adjacent memory cell mats (memory cell mat columns MAT0 and MAT2) which are adjacent to the above-mentioned memory cell mat with each of the above-mentioned sense amplifier columns interposed therebetween are connected to each other through the precharge circuits (precharge circuits PC1 and PC2), with respect to the above-mentioned memory cell mat. For this reason, it is possible to effectively suppress variation in the potentials of the bit lines at the time of precharge between the bit line pairs, and to realize an increase in the speed of the cycle time by shortening the precharge time.

As shown in FIG. 5, in the semiconductor memory device in which the precharge circuits PC2 are not provided at the far ends of the bit line pairs, the near ends of the bit lines are short-circuited by the precharge circuits and the near end portions of the bit line pairs have the same potential, as in the bit line waveform shown by a dashed line. After that, the far ends of the bit line pair are equalized, and finally the bit line pairs have the same potential in time t5. On the other hand, in the semiconductor device of the invention, a difference does not occur in the time at which the potentials of the bit line pairs have the same potential at the far ends and the near end portions of the bit lines by providing the precharge circuits PC2. In addition, the bit lines are also connected, by the precharge circuits PC1 and PC2, to the bit lines of the inactivated memory cell mats of which the potentials are fixed to the precharge potential level VPRE in the activation period of the activated mats, the time until the far ends and the near ends of the bit lines are equalized and become the precharge potential level VPRE is also shortened as compared to the semiconductor memory device in which the precharge circuits PC2 are not provided. That is, in the semiconductor memory device according to the first embodiment, the time difference between the far end and the near end is shortened, and the time until precharge is completed is also shortened. Thus, the precharge operation is completed at time t4 prior to time t5 as shown in a solid line.

Figure 6:
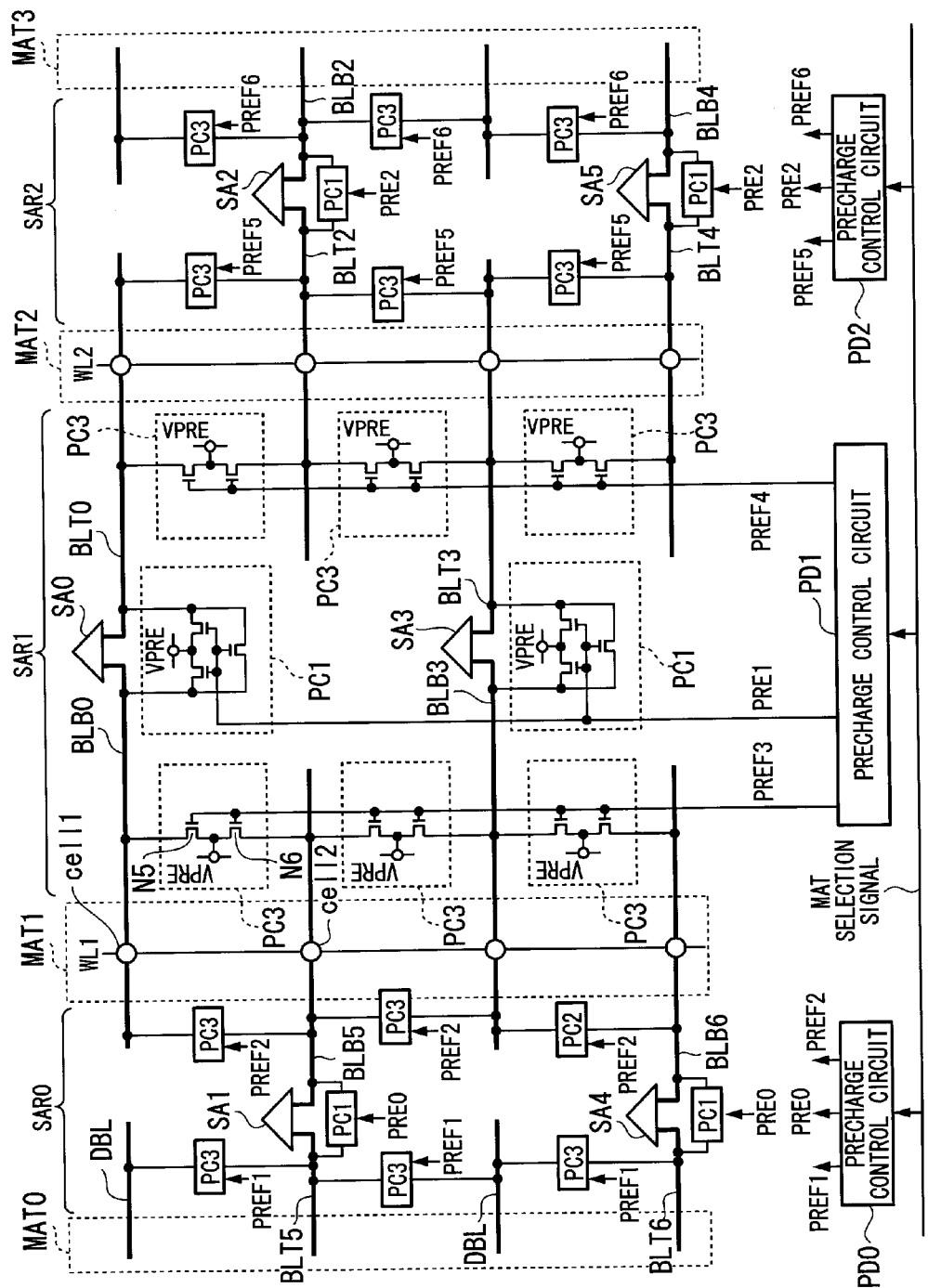
FIG. 6 is a diagram illustrating a modified configuration from the configuration of FIG. 4.

Meanwhile, as shown in FIG. 6, a third precharge circuit PC3 may be disposed in place of the second precharge circuit PC2 of FIG. 4.

The third precharge circuit PC3 is different from the second precharge circuit PC2 shown in FIG. 4, and does not have the N-channel type MOC transistor N4 for equalizing the potential between the bit line pairs. However, as mentioned above, when the second precharge signal PREF3 reaches the H level at the time of precharge of the bit line, the N-channel type MOS transistors N5 and N6 equalize the far end of the bit line BLB0 and the far end of the bit line BLB5, and precharge them to the precharge potential level VPRE. That is, the number of components can be reduced by using the third precharge circuit PC3 while maintaining the aforementioned effect, as compared with a case where the second precharge circuit PC2 is used, and thus the layout area of the semiconductor memory device can be reduced.

As mentioned above, although the invention devised by the inventor has been described on the basis of the embodiments, it will be obvious that the invention is not limited to the embodiments described here, but various changes may be made without departing from the scope of the invention.

Figure 7:
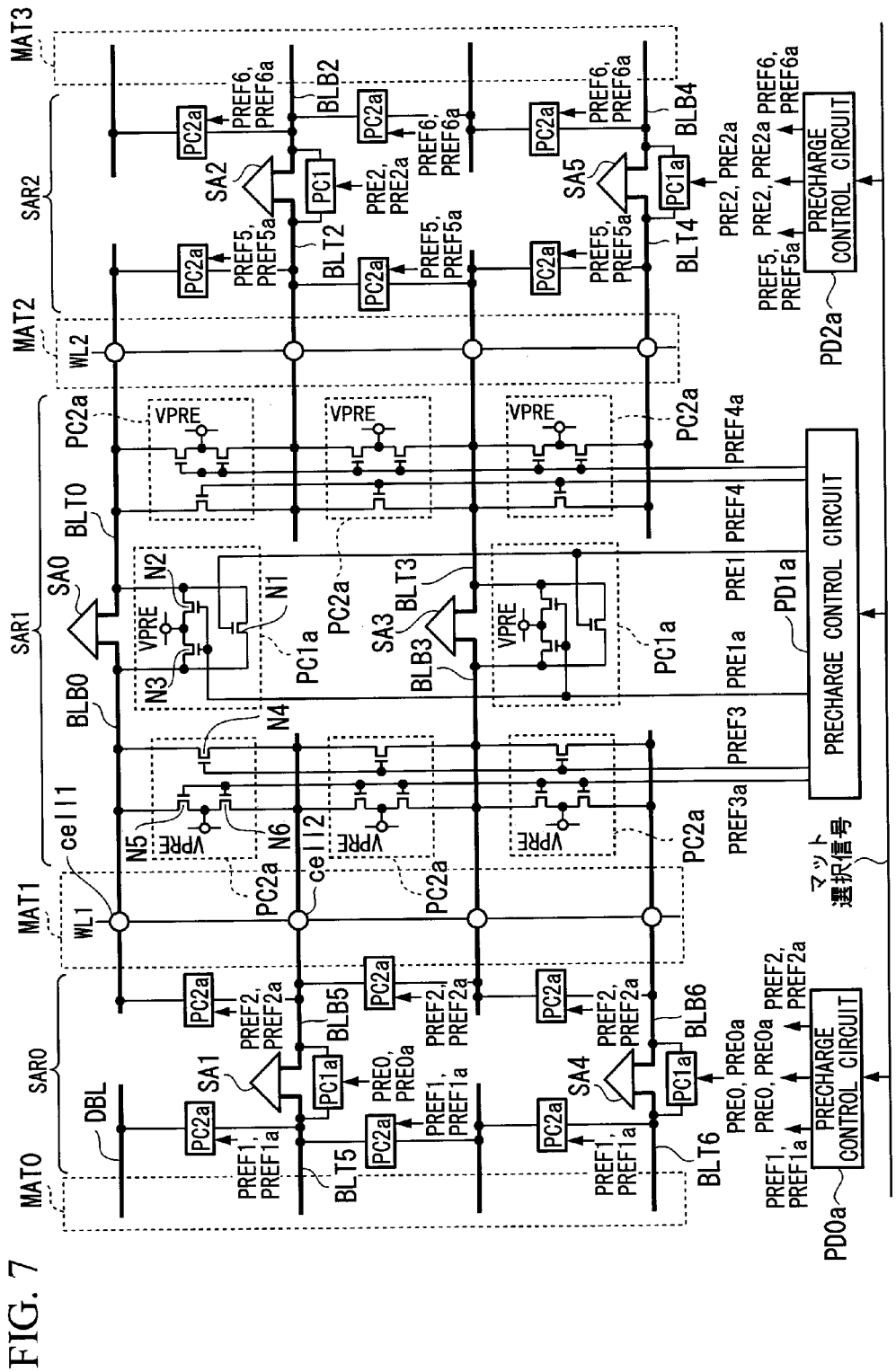
FIG. 7 is a diagram illustrating a further modified configuration from the configuration of FIG. 4.

For example, as shown in FIG. 7, a first precharge circuit PC1a and a second precharge circuit PC2a may be disposed in place of the first precharge circuit PC1 and the second precharge circuit PC2 of FIG. 4, and they may be controlled in a time-series manner. In this case, as shown in FIG. 7, when the first and second precharge circuits belonging to the sense amplifier column SAR1 are taken as an example, the transistors forming the precharge circuit are the same as the transistors in FIG. 4, and are constituted by N-channel type MOS transistors N1 to N3, and N4 to N6. In the first precharge circuit PC1a, gate input of the N-channel type MOS transistor N1 which short-circuits the bit lines is set to PRE1 as in FIG. 4. On the other hand, gate inputs of the N-channel type MOS transistors N2 and N3 which short-circuit the bit lines and set the bit line potential to the precharge potential level VPRE are set to PRE1a. In addition, in the second precharge circuit PC2a, gate input of the N-channel type MOS transistor N4 which short-circuits the adjacent bit lines at the near end and the far end thereof is set to PREF3 or PREF4 as in FIG. 4. On the other hand, gate inputs of the N-channel type MOS transistors N5 and N6 which short-circuit the adjacent bit lines at the near end and the far end thereof and set the bit line potential to the precharge potential level VPRE are set to PREF3a or PREF4a.

Figure 8:
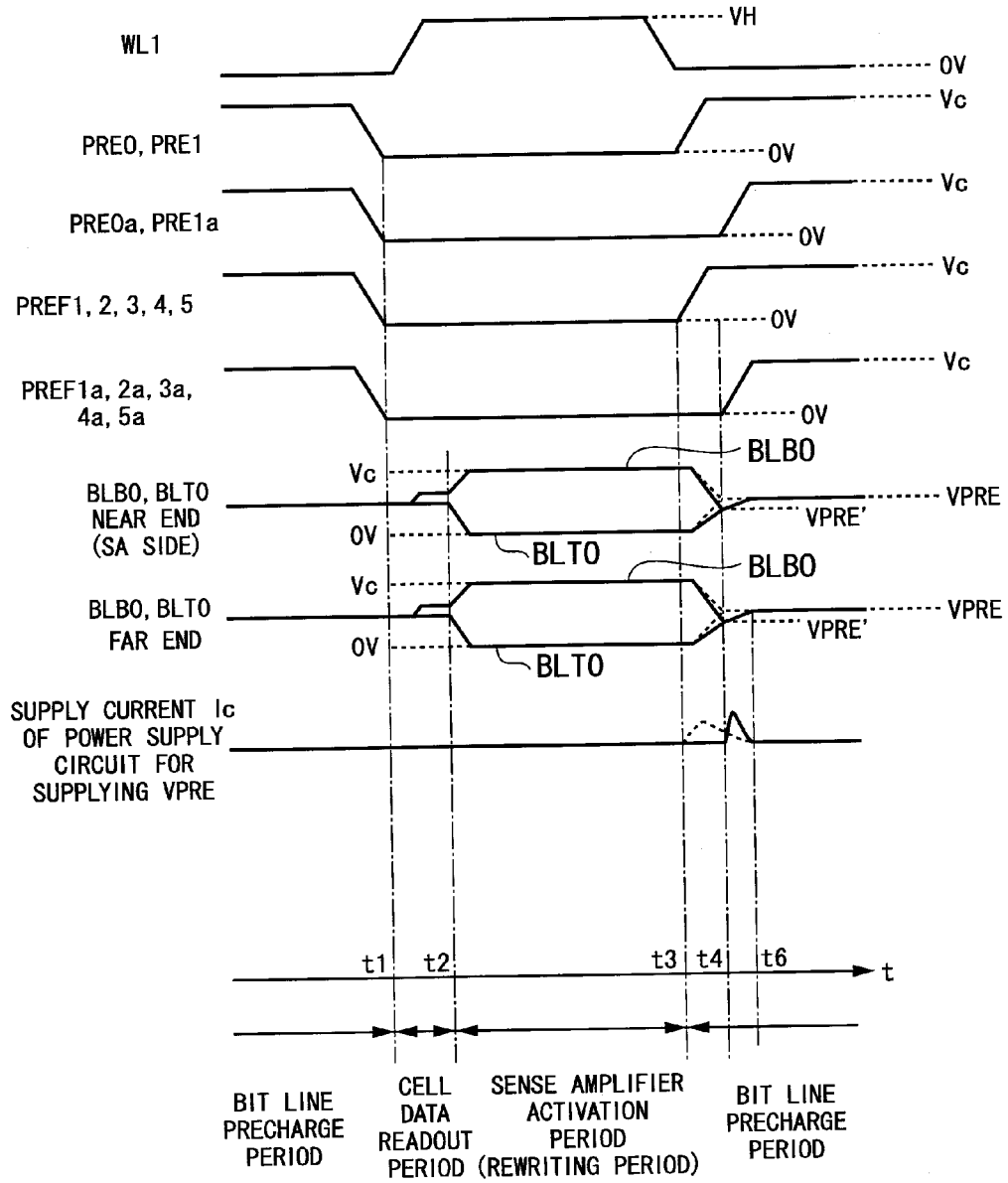
FIG. 8 is a timing chart illustrating bit line precharge operations of the configuration shown in FIG. 7.

Here, the precharge signals are input to the first precharge circuit PC1a and the second precharge circuit PC2a from a precharge control circuit PDia at the timing shown in a timing diagram of FIG. 8. The timing of changing the precharge circuit from the active state to the inactive state is time t1 before selection of the word line, similarly to FIG. 4. On the other hand, at the precharge start of time t3, the transistors initially activated are the above-mentioned N-channel type MOS transistors N1 and N4, and short-circuit the bit line pairs, or the bit line and the adjacent bit line. At this time, the short-circuited bit lines (bit lines within the memory cell mat column MAT1, and the adjacent memory cell mat columns MAT0 and MAT2) are not connected to the power supply line for supplies the precharge potential level VPRE, but are connected to the above-mentioned N-channel type MOS transistors N2 to N3 and N5 to N6 at continuing time t4.

In other words, as shown in FIG. 8, the precharge control circuit PDia does not change the precharge signals PREia and PREFia to the H level up to time t4. That is, a supply current Ic of the power supply circuit for supplying VPRE does not flow for a period of time t3 to t4 as shown by a solid line. The time taken for the precharge circuits PC1a and PC2a to change the potential of the bit line up to the precharge potential level VPRE is time t4 to t6 in the drawing, and the power supply circuit consumes the supply current Ic shown by a solid line at time t4 to t6. For example, when a power source supply line to which an operation power-supply voltage is supplied is shared between peripheral circuits (control circuit 13, data input/output circuit 16 and the like) for performing a reset operation at the time of a precharge operation of the semiconductor memory device or a sense amplifier driving circuit, and the above-mentioned power supply circuit, the supply current Ic of the power supply circuit is moved from a dashed line to a solid line by shifting the operation start time of the power supply circuit backward. Thereby, it is possible to alleviate a voltage drop of the power source supply line by nearly simultaneous operations of the peripheral circuits or the like and the power supply circuit. In addition, since the precharge control circuit PDi also shifts backward the operation start time at which the gates of the N-channel type MOS transistors of the precharge circuits PC1a and PC2a, and the precharge signal interconnection are driven, it is possible to suppress the voltage drop of the power source supply line, when the operation power-supply interconnection to which the operation power-supply voltage of the precharge control circuit PDi is supplied is shared with the above-mentioned power source supply line.

In the case of the embodiment, the time taken for the potential of the bit line to return up to the precharge potential level VPRE is slightly slower than that of the first embodiment. However, the effect that the potential between the bit line pairs is equalized at the far end and the near end of the bit line, which is the gist of the invention, can be achieved by causing the precharge control circuit PDi to set the precharge signals PREi and PREFi to the H level at time t3.

Meanwhile, in order to quickly return the potential of the bit line up to VPRE, the equalization speed of the precharge circuit may be raised by raising an operation potential (power supply potential level Vc) of the precharge signals PREia and PREFia up to a potential Vca (Vca>Vc). Otherwise, as mentioned above, since equalization at the far end and the near end of the bit line is possible, the difference potential does not occur between the bit line pairs at the time of activation of the sense amplifier in the next cycle. For this reason, the consumption current of the precharge control circuit PDi may be suppressed by dropping the operation potential (power supply potential level Vc) of the precharge signals PREia and PREFia up to Vcb (Vcb<Vc).

The term "configured" is used to describe a component, section or part of a device includes hardware and/or software that is constructed and/or programmed to carry out the desired function.

The embodiments of methods, software, firmware or codes described above may be implemented by instructions or codes stored on a machine-accessible or machine readable medium. The instructions or codes are executable by a processing element or processing unit. The machine-accessible/readable medium may include, but is not limited to, any mechanisms that provide, store and/or transmit information in a form readable by a machine, such as a computer or electronic system. In some cases, the machine-accessible/readable medium may include, but is not limited to, random-access memories (RAMs), such as static RAM (SRAM) or dynamic RAM (DRAM), read-only memory (ROM), magnetic or optical storage medium and flash memory devices. In other cases, the machine-accessible/readable medium may include, but is not limited to, any mechanism that receives, copies, stores, transmits, or otherwise manipulates electrical, optical, acoustical or other form of propagated signals such as carrier waves, infrared signals, digital signals, including the embodiments of methods, software, firmware or code set forth above.

Furthermore, the particular features, structures, or characteristics may be combined in any suitable manner in one or more embodiments.

It is apparent that the present invention is not limited to the above embodiments, but may be modified and changed without departing from the scope and spirit of the invention.

What is claimed is:

1. A semiconductor device comprising:
   first and second amplifier circuits;
   first and second bit lines each coupled to the first amplifier circuit, the first bit line extending from the first amplifier circuit in a first direction and the second bit line extending from the first amplifier circuit in a second direction opposite the first direction;
   third and fourth bit lines coupled to the second amplifier circuit extending from the second amplifier circuit, the third bit line extending parallel to the first bit line, the third bit line extending from the second amplifier circuit in the second direction and the fourth bit line extending from the second amplifier circuit in the first direction;
   a first equalizer circuit coupled between the first bit line and the second bit line; and
   a second equalizer circuit coupled between the first bit line and the third bit line.

2. The semiconductor device according to claim 1, wherein each of the first and second bit lines is coupled to the first amplifier circuit at one end thereof, each of the third and fourth bit lines is coupled to the second amplifier circuit at one end thereof, the first equalizer circuit is coupled between the one end of the first bit line and the one end of the second bit line, and the second equalizer circuit is coupled between the other end of the first bit line and the one end of the third bit line.

3. The semiconductor device according to claim 2, further comprising:
   a plurality of third amplifier circuits arranged substantially on a line that passes through the first amplifier circuit and extends in a direction crossing the bit lines;
   a plurality of fourth amplifier circuits arranged substantially on a line that passes through the second amplifier circuit and extends in the bit line crossing direction;
   a plurality of fifth bit lines each coupled to a corresponding one of the third amplifier circuits at one end thereof and extending in parallel to the first bit line;
   a plurality of sixth bit lines each coupled to a corresponding one of the third amplifier circuits at one end thereof and extending to an opposite side to a corresponding one of the fifth bit lines with respect to a corresponding one of the third amplifier circuit in parallel to the second bit line;
   a plurality of seventh bit lines each coupled to a corresponding one of the fourth amplifier circuits at one end thereof and extending in parallel to the third bit line;
   a plurality of eighth bit lines each coupled to a corresponding one of the fourth amplifier circuits at one end thereof and extending to an opposite side to a corresponding one of the seventh bit lines with respect to a corresponding one of the fourth amplifier circuit in parallel to the second bit line;

a plurality of third equalizer circuits each coupled between the one end of a corresponding one of the fifth bit lines and the one end of a corresponding one of the sixth bit lines; and a plurality of fourth equalizer circuits each coupled between the other end of a corresponding one of the fifth bit lines and the one end of a corresponding one of the seventh bit lines.

4. The semiconductor device according to claim 1, further comprising:

first and second areas; and a first memory cell mat sandwiched between the first and second areas, the first and second areas and the first memory cell mat being arranged in a bit line extension direction in which the bit lines extend, and wherein the first and second amplifier circuits are disposed respectively on the first and second areas.

5. The semiconductor device according to claim 4, further comprising second and third memory cell mats, the second memory cell mat being arranged so that the first area is sandwiched between the first and second memory cell mats, the third memory cell mat being arranged so that the second area is sandwiched between the first memory cell mat and the third memory cell mat, and wherein each of the first, the second and the third memory cell mats includes a plurality of memory cells, each of the first and third bit lines is coupled to a corresponding one of the memory cells of the first memory cell mat, the second bit line is coupled to a corresponding one of the memory cells of the second memory cell mat, and the fourth bit line is coupled to a corresponding one of the memory cells of the third memory cell mat.

6. The semiconductor device according to claim 4, further comprising:

a third equalizer circuit coupled between the one end of the third bit line and the one end of the fourth bit line; and a fourth equalizer circuit coupled between the one end of the first bit line and the other end of the third bit line.

7. The semiconductor device according to claim 6, further comprising:

a first precharge control circuit supplying first and second equalize activation signals to the first and second equalizer circuits, respectively; and a second precharge control circuit supplying third and fourth equalize activation signals to the third and fourth equalizer circuits, respectively, and wherein the first equalizer circuit is activated in response to the first equalize activation signal to precharge the first and second bit lines, the second equalizer circuit is activated in response to the second equalize activation signal to precharge the first and third bit lines, the third equalizer circuit is activated in response to the third equalize activation signal to precharge the third and fourth bit lines, and the fourth equalizer circuit is activated in response to the fourth equalize activation signal to precharge the first and third bit lines.

8. The semiconductor device according to claim 1, wherein the semiconductor device is an open bit line-type semiconductor device.

9. A semiconductor device comprising:

first and second amplifier circuits;

first and second bit lines each coupled to the first amplifier circuit, the first bit line extending from the first amplifier circuit and the second bit line extending to an opposite side to the first bit line with respect to the first amplifier circuit;

third and fourth bit lines coupled to the second amplifier circuit, the third and fourth bit lines extending from the second amplifier circuit and the fourth bit line extending to opposite side to the third bit line with respect to the second amplifier circuit;

a first equalizer circuit coupled between the first bit line and the second bit line;

a second equalizer circuit coupled between the first bit line and the third bit line;

a third equalizer circuit coupled between the one end of the third bit line and the one end of the fourth bit line;

a fourth equalizer circuit coupled between the one end of the first bit line and the other end of the third bit line;

first and second areas; and a first memory cell mat sandwiched between the first and second areas, the first and second areas and the first memory cell mat being arranged in a first direction in which the bit lines extend, wherein the first and second amplifier circuits are disposed respectively on the first and second areas, and wherein the third equalizer circuit is disposed on the second area and the fourth equalizer circuit is disposed on the first area.

* * * * *